US006801072B2

(12) United States Patent
Guinea et al.

(10) Patent No.: US 6,801,072 B2
(45) Date of Patent: Oct. 5, 2004

(54) DELAY LOCKED LOOP CIRCUIT WITH CONVERGENCE CORRECTION

(75) Inventors: Jesus Guinea, Brembate (IT); Luciano Tomasini, Monza (IT)

(73) Assignee: STMicroelectronics s.r.l., Agrate Brianza (IT)

( * ) Notice: Subject to any disclaimer, the term of this patent is extended or adjusted under 35 U.S.C. 154(b) by 0 days.

(21) Appl. No.: 10/184,777

(22) Filed: Jun. 27, 2002

(65) Prior Publication Data

US 2003/0006815 A1 Jan. 9, 2003

(30) Foreign Application Priority Data

Jun. 28, 2001 (EP) .............................................. 01830437

(51) Int. Cl.[7] .............................................. H03H 11/26
(52) U.S. Cl. ...................................... 327/277; 327/278
(58) Field of Search ................................ 327/149, 158, 327/276, 277, 278

(56) References Cited

U.S. PATENT DOCUMENTS

| 5,764,092 A | 6/1998 | Waoa et al. |
| 6,239,627 B1 | 5/2001 | Brown et al. |
| 6,300,807 B1 * | 10/2001 | Miyazaki et al. ........... 327/158 |
| 6,373,308 B1 * | 4/2002 | Nguyen ....................... 327/161 |
| 6,404,248 B1 * | 6/2002 | Yoneda ....................... 327/158 |
| 6,476,652 B1 * | 11/2002 | Lee et al. ................... 327/158 |
| 6,476,653 B1 * | 11/2002 | Matsuzaki .................. 327/158 |

FOREIGN PATENT DOCUMENTS

EP    1094608 A1    4/2001

* cited by examiner

Primary Examiner—Terry D. Cunningham
(74) Attorney, Agent, or Firm—Hogan & Hartson, L.L.P.

(57) ABSTRACT

The present invention relates a circuit for generating a digital output signal (56) locked to a phase of an input signal (24), comprising a plurality of delay cells (42), a first register (31) containing a first value, a phase detector (26) and a control logic (25), which is characterized by comprising a plurality of flip-flop devices (37, ..., 38), wherein storing said first value, a second register (30) containing a second value, a plurality of adder nodes (33) adapted to sum in each of said delay cells (42) said second value with the content of said selected flip-flop device (37, ..., 38), being said delay cells (42) adapted to provide said digital output signal (56), said phase detector (26), receiving said input signal (24) and said digital output signal (56), adapted to detect the phase difference (27) between said input signal and said digital output signal (56), said control logic (25) adapted to control said first and second value in function of said phase difference (27). (FIG. 7)

13 Claims, 4 Drawing Sheets

DELAY LOCKED LOOP CIRCUIT WITH CONVERGENCE CORRECTION

FIELD OF THE INVENTION

The present invention relates to a circuit able to generate periodic signals such as clock signals. More particularly, the present invention relates to an improved delay locked loop circuit.

BACKGROUND OF THE INVENTION

Many high speed electronic systems possess critical timing characteristics, which dictate the need to generate a periodic clock wave form so as to establish a precise time relationship with respect to one or more reference signals.

In fact the clock signal may need to be adjusted to stay in sync with the reference signal.

Usually, a phase locked loop circuit (PLL), which employs a voltage control oscillator (VCO), is used to provide the desired clock signal.

However, the VCO circuit based on PLL circuits shows some problems, such as the fake convergence, the stability and the need of a specific technology to implement the circuit.

Moreover, a PLL circuit is scalable with difficulty.

Moreover, in order to achieve the desired time relationship, the acquisition of information requires multiple iterations of signal through the PLL circuit, so as the time required can drive the VCO circuit to the correct frequency.

An alternative PLL circuit is the delay locked loop circuit (DLL) which generates a plurality of output signals with a predetermined delay with respect to an input reference signal.

In fact a PLL circuit changes the generated clock by adjusting a voltage input to the VCO circuit, whereas the DLL circuit adjusts the generated clock by adjusting a bias voltage to a series of buffers (in the case of a DLL circuit implemented in analog technology).

The DLL circuits are routinely employed in high speed phase alignment circuits, such as in Synchronous Dynamic Random Access Memories (SDRAM) and in microprocessors. Especially, due to their intrinsic simply design and stability, a DLL circuit is employed in all the applications where no clock synthesis is required.

Moreover, the DLL circuit is employed in circuits such as a serializer/deserializer, wherein the phase signals have to be equally spaced in time domain.

The general method that makes signals equally spaced in the time domain is to tap a chain of delay elements, wherein the delay time is controlled by a DLL circuit. Therefore, the DLL circuit obtains N equispaced phases (within a round angle) out of the input clock.

FIG. 1 shows a conventional DLL circuit.

A master clock signal MCLK 1 is input both a phase frequency detector (PFD) 2 and to a delay line 3. The delay line 3 can be implemented as a series of cells (not shown in FIG. 1), called delay cells.

An output 4 of the delay line 3 is input to the same PFD 2. A control logic 5 selects which tap out $\phi 1 - \phi n$ is propagated to the output.

The phase difference between the phase of the signal 4 and the phase of the MCLK 1, gives an indication of a phase error $\epsilon$ to the control logic 5.

The control logic 5 responds to this phase error $\epsilon$, counting upwards when the output 4 of the delay line 3 changes before the master clock signal MCLK 1, or counting downward when the output 4 of the delay line 3 changes after said master clock signal MCLK 1.

FIG. 2 shows outputs of the tap number zero, indicated as "t0", and one, indicated as "t1", along side the master clock MCLK 1.

As shown in such a FIG. 2, the two taps "t0" and "t1" are equally-spaced to each other by $\tau$ seconds.

Many factors may affect the number of clock cycles and the equispacing among the taps, such as the operating temperature, the process of implementing of the DLL circuit, especially the implementation of a delay cell, and the operating voltage of the DLL circuit.

As FIG. 3 shows, the clock signals 9, 10 and 11 output from taps 4 on the delay line 3 and they tend to jitter, that is they tend to vary in the time domain.

The rising edge of the clock signal 10 or 11 or both, does not always follow the rising edge of the master clock signal MCLK 1 by a fixed delay.

Moreover, in a conventional DLL's architecture, the phase of the signal 4 and the phase of the MCLK 1 are not always aligned for every condition of temperature, voltage supply and process.

Furthermore, in some cases of undesired transitions on the voltage supply, caused, for example, by an hot insertion of a printed circuit board, may occur a corruption of the values stored in the delay cells of the delay line 3, and in these cases, sometimes, there is a fake convergence.

In the case of a fake convergence, the control logic 5 may output a random value, and, therefore, the control logic 5 proceeds to count up or down based upon the phase error $\epsilon$ corresponding to this random value.

SUMMARY OF THE INVENTION

In view of the state of the art described, it is an object of the present invention to solve the aforementioned problems, and particularly to guarantee the arrival at the correct convergence from whatever initial condition is set to the DLL circuit.

Another object of the present invention is to guarantee the DLL circuit stays in the condition of convergence whatever conditions are settled.

According to the present invention, such object is attained by a circuit for generating a digital output signal locked to a phase of an input signal, comprising a plurality of delay cells, a first register containing a first value, a phase detector and a control logic, characterized by comprising a plurality of flip-flop devices, wherein storing said first value, a second register containing a second value, a plurality of adder nodes adapted to sum in each of said delay cells said second value with the content of said selected flip-flop device, being said delay cells adapted to provide said digital output signal, said phase detector, receiving said input signal and said digital output signal, adapted to detect the phase difference between said input signal and said digital output signal, said control logic adapted to control said first and second value in function of said phase difference.

Thanks to the present invention it is possible to realize a DLL circuit able to solve the problem of the fake convergence.

Thanks to the present invention it is also possible to realize a DLL circuit easier with respect to the prior art.

Thanks to the present invention it is also possible to realize an updating technique of the DLL circuit taps without lock problems.

BRIEF DESCRIPTION OF THE DRAWINGS

The features and the advantages of the present invention will be made evident by the following detailed description of one its particular embodiment, illustrated as a non-limiting example in the annexed drawings, wherein.

DETAILED DESCRIPTION

Figure 1:
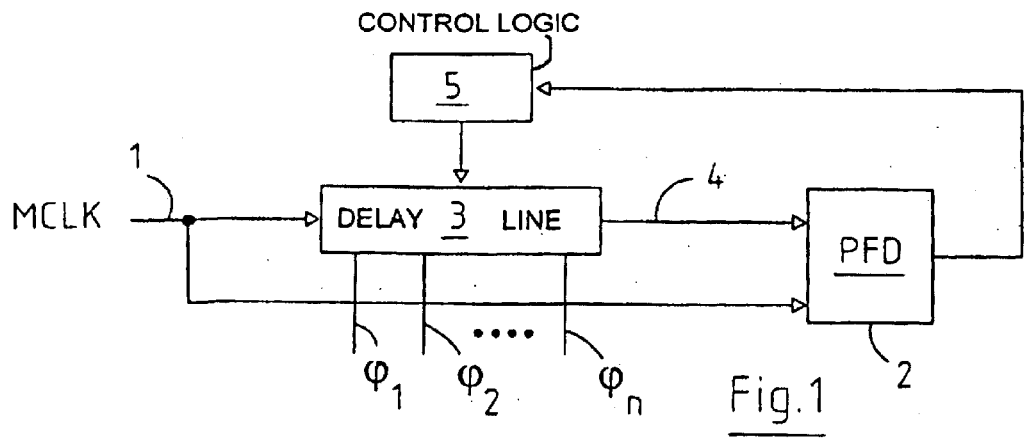
FIG. 1 shows a block diagram of a conventional embodiment of a DLL circuit according to the prior art.
Figure 2:
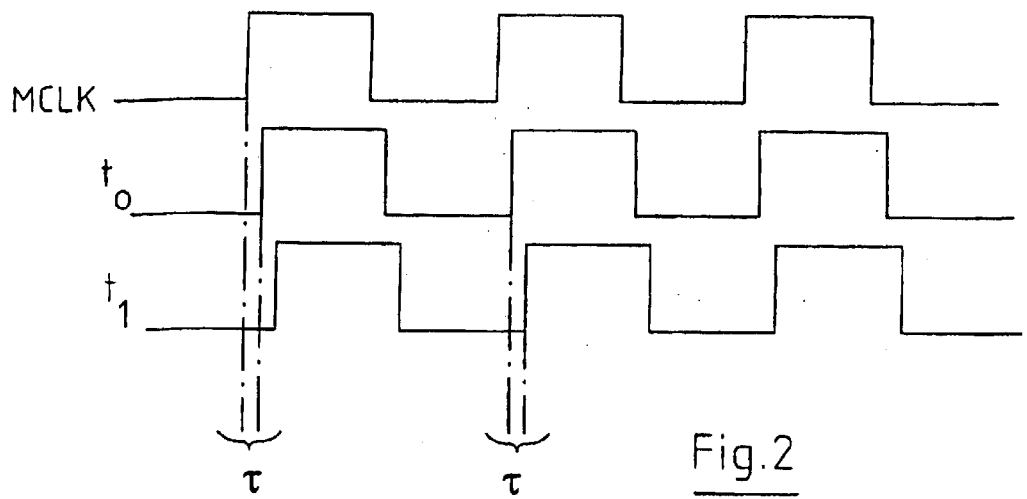
FIG. 2 shows an illustration of the output taps of the delay line taps which are delayed copies of the master clock signal according to the prior art.
Figure 3:
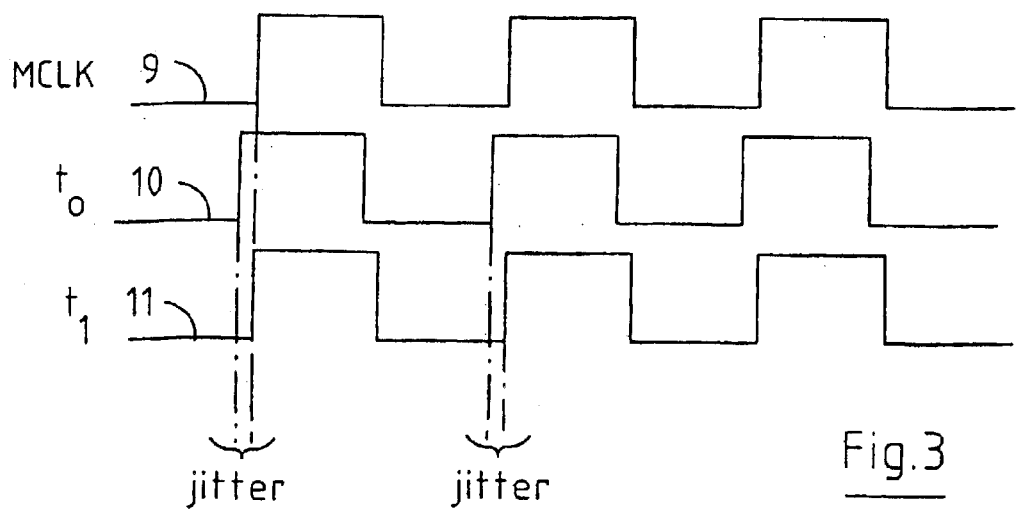
FIG. 3 shows an illustration of jitters at the output of a single tap over time domain according to the prior art.
Figure 4:
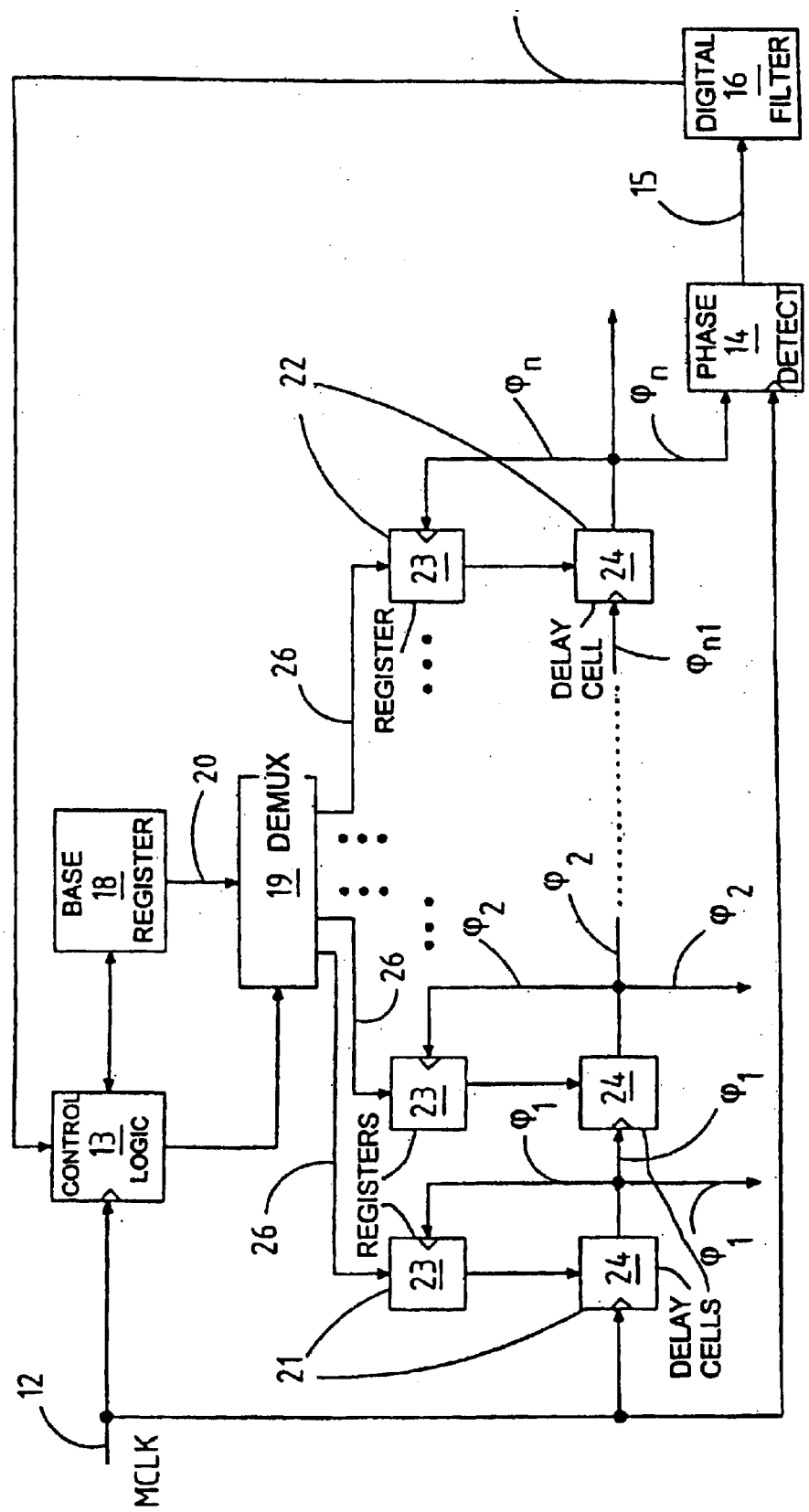
FIG. 4 shows a block diagram of an embodiment of a DLL circuit.

In FIG. 4, a block diagram of an embodiment of a DLL circuit is shown.

A master clock signal MCLK 12 is input to a control logic 13, to a phase detector 14 and to a plurality of delay cells 24.

The phase detector 14 compares a phase $\phi_n$ of the last of said delay cells 24 of the delay locked loop circuit with that of the master clock signal MCLK 12.

The output signal 15 of the phase detector 14 is input to a digital filter 16, the function of which is to integrate the output signals 15 of the phase detector 14 over the time domain.

The digital filter 16 outputs a signal 17 that is input said control logic 13.

The control logic 13 controls a base register (BR) 18 and a demultiplexer (DEMUX) 19. Particularly the output signal 20 of said base register BR 18 is input to the DEMUX 19.

Moreover, the DEMUX 19 connects, by means of a plurality of lines 26, a plurality of devices 21–22, each one of which comprises a respective register 23, and one of said plurality of delay cells 24.

In particularly, the first of said delay cells 24 has input the master clock signal MCLK 12, and each one of said delay cells 24 outputs a signal $\phi 1-\phi_n$ that is fed back to the associated register 23.

Therefore, each one of the output phase signals $\phi 1-\phi_n$ represents a sync signal for said associated register 23.

The phase detector 14 is, for example, a phase detector wherein the output signal 15 is a binary signal, that is high if the output of the DLL circuit is ahead in phase of the master clock MCLK 12 and is low if the output of the DLL circuit is before in phase of the master clock MCLK 12.

The phase difference between the phase $\phi_n$ of the last of said delay cells 24 and the phase of the master clock signal MCLK 12, gives an indication of a phase error $\phi$ to the control logic 13.

The control logic 13 responds to this phase error $\epsilon$, counting upwards when the output $\phi_n$ changes before the master clock signal MCLK 12, or counting downward when the output $\phi_n$ changes after the master clock signal MCLK 12.

In this way the control logic 13 responds to this phase error $\epsilon$, changing the value stored in the base register BR 18, and therefore updating the value of each of said delay cells 24.

When the DLL circuit is locked, that is when the DLL circuit is working appropriately, the following mathematical formula among a delay time D, for each of said delay cells 24, the master clock period signal T and the number of total delay cells N, is satisfied:

$$D*N=T \qquad (1)$$

By rewriting the equation (1), the delay time D for each of said delay cells 24 can be expressed as below:

$$D=T/N \qquad (2)$$

According to the mathematical formula (2), the delay time D can be reduced by increasing the number N of the delay cells 24, but, however, the delay time D can not be less than intrinsic delay of each of said delay cells 24.

Moreover, the stored values in each register 23 have to be distinct at least of 61 last significant bit (LSB).

A DLL circuit, as shown in FIG. 4, is a feed back loop circuit that must align its total delay duration to one period T of the master clock signal MCLK, as before described.

In fact the internal delay chain, made by the plurality of devices 21–22 is controlled dynamically to bring each delay time D to the objective T/N.

Once the DLL circuit is locked, that is under convergence, the control logic 13 stays around of the point of convergence, or in other word the DLL circuit dithers around this point, with a precision depending on the resolution of same DLL circuit.

The DLL circuit, of the embodiment shown in FIG. 4, has a control logic 13, which is centralized. In fact the DLL circuit sequentially commands the N delay cells 24.

The master clock signal MCLK 12 is, therefore, the signal to be corrected using the DLL circuit.

The DLL circuit, particularly, writes a digital control word (not shown in Figure) to each of said delay cells 24, and the logic control 13 delivers the writing command.

The resolution of this digital control word depends on the resolution of the same DLL circuit.

The DLL circuit works in the better conditions, if it starts from a controlled initial condition, that is, for example, if all the registers 23 contain the same value or al least shifted by one LSB.

Figure 5:
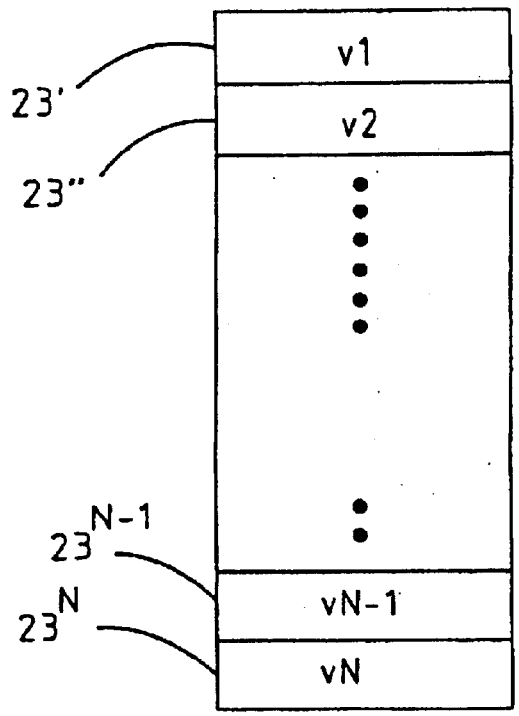
FIG. 5 shows an illustration of the content of a device of FIG. 4.

As shows FIG. 5, wherein an illustration of the N registers 23 is described, if all the registers 23', 23", ..., $23^{N-1}$ and $23^N$ contain the respective identical value v1, v2, ..., vN−1 and vN or values offseted by a LSB, the following mathematical formulas are always true:

$$\forall i, k[v(i)-v(k)]=1 \text{ or } 0 \text{ bit} \qquad (3)$$

with i and k enclosed in a range form 1 to N, and:

$$\sum_{1}^{N} v(i) = T\sec(4)$$

where T is the period of the master clock signal MCLK 12.

In fact the formula (3) states that the difference value between two registers v(i) and v(k) is always 1 or 0, that is the respective values stored in each register 23', ..., $23^N$ are shifted by an LSB, whilst the formula (4) states that the sum of all the values stored in each register 23', ..., $23^N$ is always equal to master clock signal MCLK, having a period T.

However with such an embodiment, shown in FIG. 4, a DLL circuit, in case of the N registers 23 start from a random value, may occur in a fake convergence.

This is due to the logic control 13 that has no knowledge of the values stored in each register 23.

In fact, the control logic 13 trusts that what it has written is still in one of N registers 23, that is such a DLL circuit doesn't show an observability of the state of the N registers 23.

In fact, by assuming that the embodiment shown in FIG. 4 is under convergence, that is the logic control 13 stays around the point of convergence with a precision dependent on the resolution of the specific DLL circuit, in the case of an external occurrence, such as noise supply at the power up, etc., the values stored in the N registers 23 may change.

Figure 6:
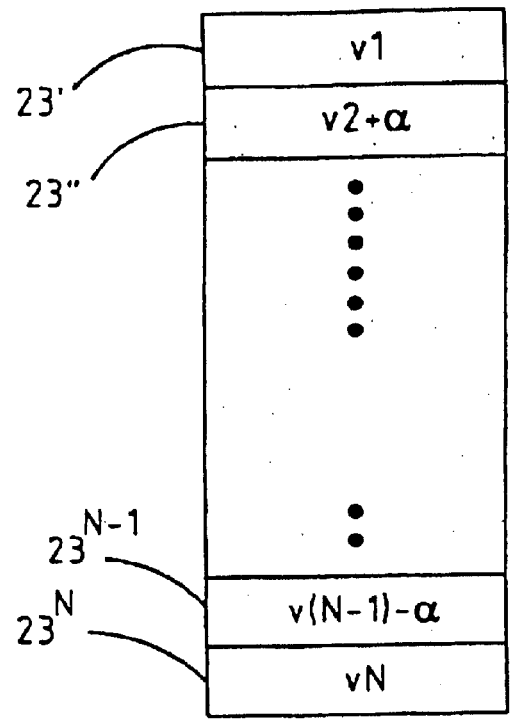
FIG. 6 shows another illustration of the content of another device of FIG. 4.

In FIG. 6 is shown such an eventuality, wherein another illustration of the N registers 23 is described.

The value stored in the register 23″ is changed by non-deterministic events, such as by ripples of the supply voltage or by noise or other, by a positive quantity $+\alpha$, whereas the value stored in the register $23^{N-1}$ is changed by a negative quantity $-\alpha$. This is the eventuality of the so called "blind corruption", that is one or more of the N register 23 lose their values and the logic controller 13 does not known that this is happened.

This means that the mathematical formula (3) is not true, because there is a difference between two registers bigger than one or zero, that is:

$$\forall i,k[v(i)-v(k)] \neq 1 \text{ or } 0 \text{ bit} \qquad (5)$$

The DLL circuit still works, but the characteristic of the phase equidistant is lost, even if the total sum of the values stored in the N register is still equal to a period T of the master clock signal MCLK 12. This means that the mathematical formula (4) is still true.

However, the DLL circuit is, in a faked convergence.

Moreover in the case of external occurrences, also the value stored in the base register BR 18 may change, however this eventuality does not give particular problems, because the DLL circuit is still able to achieve a convergence value.

Figure 7:
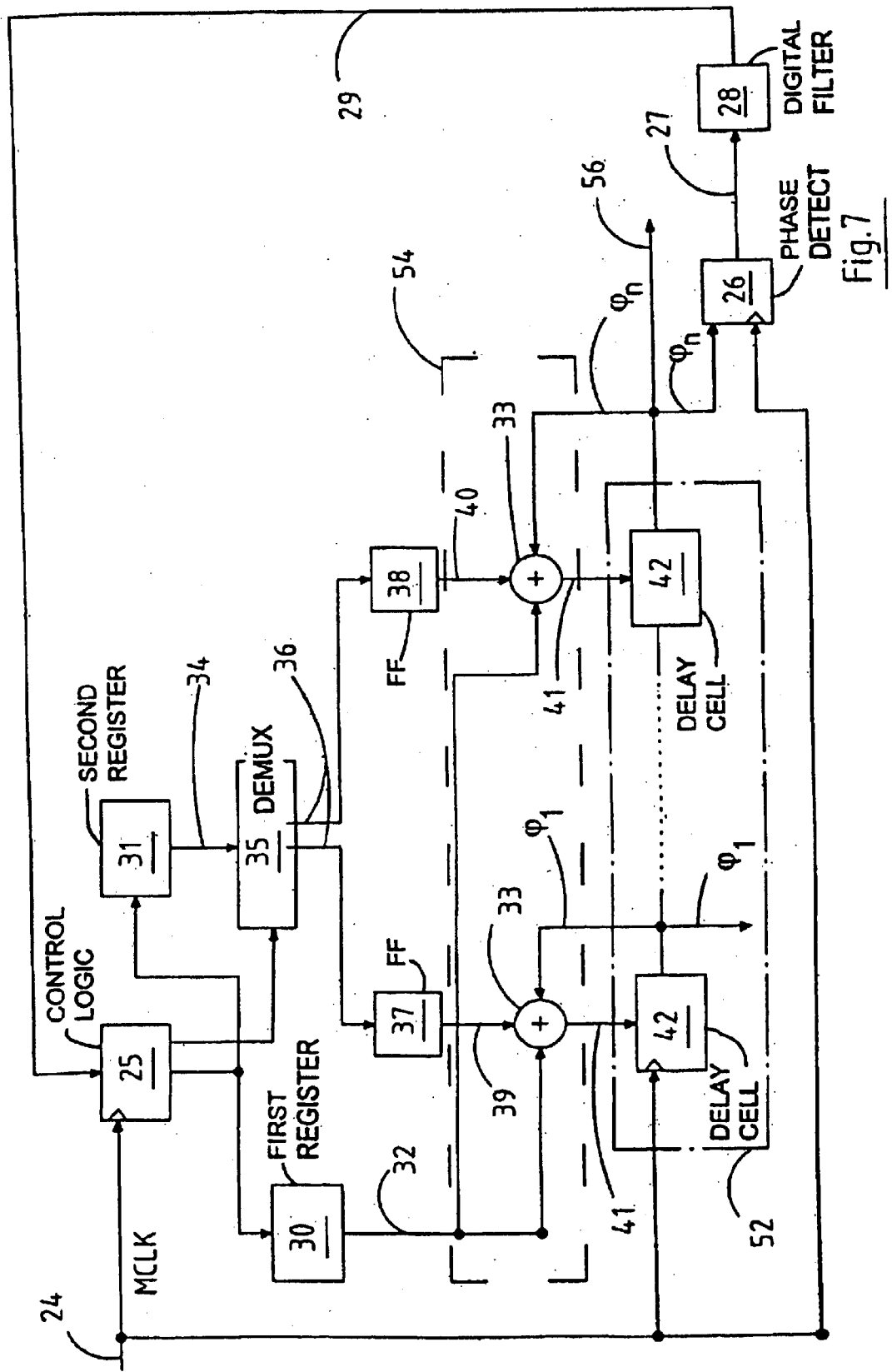
FIG. 7 shows a block diagram of another embodiment of a DLL circuit according to the present invention.

In FIG. 7 a block diagram of an embodiment of a DLL circuit according to the present invention is shown.

A master clock signal MCLK 24 is input to a control logic 25, to a phase detector 26 and to a delay means 52.

The delay means 52 are connected with an adder block 54. The adder block 54 is connected with a first register 30 and with a plurality of storage devices 37-38.

Said plurality of storage devices 37-38 are connected with a selector means 35. The selector means 35 is connected with a second register 31.

The delay means 52 comprises a plurality of delay cells 42.

The adder block 54 comprises a plurality of adder nodes 33. Each of said delay cells 42 is coupled with a respective adder node 33.

The control logic 25 controls said first 30 and second 31 register, wherein the first register 30 contains a value that indicates which one of said plurality of storage devices 37-38 has to be incremented of an incremental bit, whilst said second register 31 is a base register (BR).

Particularly, the output signal 32 of said first register 30 is input to said plurality of adder nodes 33 and the output signal 34 of said base register BR 31 is input to said selector means 35.

The selector means 35 is a demultiplexer (DEMUX), that distributes the value 34 to said plurality of storing devices 37-38.

Moreover the DEMUX 35 connects, by a plurality of lines 36, said plurality of devices 37-38.

In fact the output signals 39-40 of each one of said devices 37-38 are input into said plurality of adder nodes 33.

Moreover each adder node 33 outputs a signal 41 that is input in a respective delay cell 42.

In particularly, the first of said delay cells 42 has input the master clock signal MCLK 24, and said plurality of delay cells 42 outputs a respective phase signals $\phi 1-\phi_n$, that is fed back for each one of said adder nodes 33, and, therefore, these phase signals $\phi 1-\phi_n$ act as sync signals.

The phase detector 26 compares a phase $\phi n$ of the last of said delay cells 42, that is the delayed output of the locked loop circuit, with respect to the master clock signal MCLK 24.

The output signal 27 of the phase detector 26 is input to a digital filter 28, the function of which is to integrate over time domain the output signals 27 of the phase detector 26.

The digital filter 28 outputs an signal 29 that is input said control logic 25.

The phase detector 26 is, for example, a phase detector wherein the output signal 27 is a binary signal, that is high if the output of the DLL circuit is ahead in phase of the master clock signal MCLK 24 and low if the output of the DLL circuit is before in phase of the master clock signal MCLK 24.

The embodiment, shown in FIG. 7, is, therefore, a fully digital delay locked loop (DLL) circuit.

In fact, the adder register 30 outputs an incremental bit value 34, that is the line 32, to each one of said adder nodes 33, and the base register 31 outputs a digital "base word" to the DEMUX 35, so as the DEMUX 35 selects which one of said devices 37-38 is to update with said incremental bit value 34.

The devices 37-38 are devices of flip-flop type, that is these devices store only the local increment to exert for each of said delay cells 42. The stored value can be only one or zero.

The embodiment shown in FIG. 7 forces the observability of the states of the flip-flop devices 37-38, by means of the control logic 25.

In fact, whereas the precedent embodiment wrote an absolute delay value v1, v2, and vN into the respective N registers 23′, 23″, and 23N, the actual approach foresees that the logic controller 25 always knowing the value stored in the base register BR 31.

Moreover, the control logic 25 controls the adder register 30, that is the adder control 30 is able to increment the stored value in each of said delay cells 42, deviated or not by one LSB.

With this way of working, the present embodiment avoids the faked convergences.

In fact thanks to the fed back of the phase detector 26, which outputs an indication of the phase error $\epsilon$, the control logic 25 responds to this phase error $\epsilon$, adding the value stored in the base register BR 31, so as to the value of each of said delay cells 42 can be modified of only one LSB, which is within of the desired resolution established by the formula D=T/N.

Therefore in the case of an external occurrence the only values that can be lost, are those stored in said flip-flop 37-38.

Even if these value are lost, the only consequence is that the respective delay cell 24, associated to the particular flip-flop, changes its stored value of only a LSB.

In this way the mathematical formulas (3) and (4), before stated, are always true and the DLL circuit is always in convergence.

Figure 8:
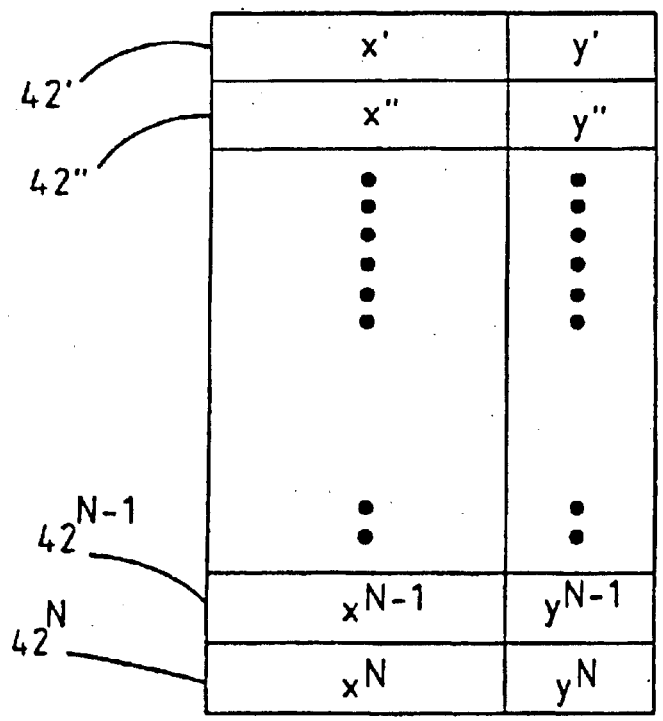
FIG. 8 shows an illustration of the content of a device of FIG. 7.
Figure 8:
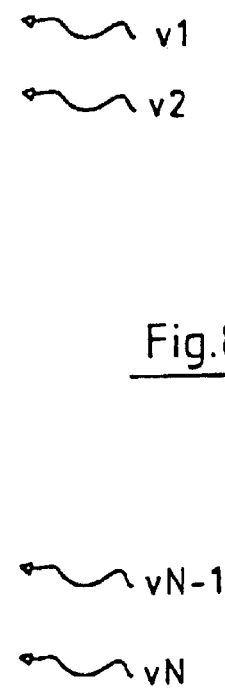

FIG. 8 shows such eventuality.

The illustration, shown in FIG. 8, represents the content of the plurality of delay cells 42.

In this case the values v1, v2, ..., vN-1 and vN, respectively stored in each delay cell 42', 42", ..., $42^{N-1}$ and $42^N$, are composed from the value added by the base register BR 30, respective portions x', x", ..., $x^{N-1}$, and $x^N$, and from the adder register 31, respective portions y', y", ..., $y^{N-1}$, and $y^N$.

The values of the portions y', y", ..., $y^{N-1}$, and $y^N$ represent the last significant bit LSB bit, which is within the resolution desired, as the following mathematical formula sustains:

$$\sum_{1}^{N}[x(m)+y(m)] = N(5)$$

The formula (5) sustains that the portions x', x", ..., $x^{N-1}$, and $x^N$ contain all the same value, whereas the portions y', y", ..., $y^{N-1}$, and $y^N$ contain values different to each other by only a LSB.

Therefore in the specific embodiment, shown in FIG. 4, the control logic 13 writes in each one of said registers 23 every time that a new correction is to be exerted, in function of the phase error ε detected by the phase detector 14.

Instead, in the embodiment of the present invention, shown in FIG. 7, the logic control 25 writes the stored value in the base register BR 31 and added it to the value stored in the adder register 30, so as to write directly into each one of said delay cells 42.

In this way it is possible to control also the delay of each one of said delay cells 42.

What is claimed is:

1. A circuit for generating a digital output signal locked to a phase of an input signal, comprising:

control logic having a first input for receiving the input signal;

a first register containing a first value coupled to an output of the control logic;

a second register containing a second value coupled to the output of said control logic;

a plurality of serially-coupled delay cells;

a plurality of flip-flop devices;

a demultipexer having an input coupled to an output of the first register and an output coupled to an input of each of the flip-flop devices, the demultiplexer receiving a control signal from said control logic;

a plurality of adder nodes having a first input coupled to an output of a corresponding flip-flop device, a second input coupled to an output of said second register, and an output coupled to an input of a corresponding delay cell;

a phase detector having a first input coupled to one of the delay cells and a second input for receiving the input signal;

a digital filter having an input coupled to an output of the phase detector and an output coupled to a second input of the control logic; and an output coupled to an output of one of the delay cells for generating an output signal.

2. The circuit of claim 1 wherein a first of the plurality of delay cells receives the input signal.

3. The circuit of claim 1 wherein the phase detector is coupled to a last one of the plurality of delay cells.

4. The circuit of claim 1 wherein at least one of the delay cells is coupled to a corresponding one of the plurality of flip-flop devices.

5. The circuit of claim 1 wherein the output signal is generated by a last of the plurality of delay cells.

6. The circuit of claim 1 wherein the first value is an incremental value composed of N bits, wherein N comprises the resolution of the circuit.

7. The circuit of claim 1 wherein the second value is an incremental bit, comprising a value zero or one.

8. The circuit of claim 1 wherein the digital filter comprises means for integrating the output signal of phase detector in the time domain.

9. A circuit for generating an output signal locked to a phase of a clock signal comprising:

control logic for receiving the clock signal;

a first register coupled to the control logic;

a second register coupled to the control logic;

a demultiplexer having an input coupled to the first register, the demultiplexer receiving a control signal from said control logic;

a storage block having at least two inputs coupled to the demultiplexer;

an adder block having at least two inputs coupled to the storage block and having at least one input coupled to the second register;

a delay block having at least two inputs coupled to the adder block and an output for generating an output signal;

a phase detector for receiving the clock signal and the output signal; and a digital filter having an input coupled to an output of the phase detector and an output coupled to the control logic.

10. The circuit of claim 9, wherein the output signal comprises a digital output signal.

11. A method of generating a digital output signal locked to a phase of an input signal comprising the steps of:

determining and digitally filtering a phase difference with a phase detector that compares phases of the input signal and the output signal;

generating a first value for a base register and a second value for a second register with control logic, wherein the control logic determines the first value and the second value based on the digitally filtered phase difference;

establishing a delay in a plurality of delay cells based on the first value;

incrementing the delay of at least one of said delay cells based on the second value; and delaying the output signal based on the plurality of the delay cells.

12. The method of claim 11, wherein the first value is a base word.

13. The method of claim 11, further comprising the step of integrating the phase difference before the phase difference reaches the control logic.

* * * * *